(12) United States Patent
Islam et al.

(10) Patent No.: US 7,368,395 B2
(45) Date of Patent: May 6, 2008

(54) METHOD FOR FABRICATING A NANO-IMPRINTING MOLD

(75) Inventors: M. Saif Islam, Mountain View, CA (US); Gun Young Jung, Mountain View, CA (US); Yong Chen, Sherman Oaks, CA (US); R. Stanley Williams, Redwood City, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 11/601,084

(22) Filed: Nov. 16, 2006

(65) Prior Publication Data

US 2007/0066070 A1 Mar. 22, 2007

Related U.S. Application Data

(62) Division of application No. 10/826,056, filed on Apr. 16, 2004, now Pat. No. 7,141,866.

(51) Int. Cl.
*H01L 21/461* (2006.01)
(52) U.S. Cl. ............ 438/738; 438/745; 438/753; 438/756; 257/E21.305
(58) Field of Classification Search ........... 438/745, 438/750, 753, 756–757, 735, 738; 257/E21.305
See application file for complete search history.

(56) References Cited

U.S. PATENT DOCUMENTS

| | | | |
|---|---|---|---|
| 5,772,905 A | 6/1998 | Chou | |
| 6,294,450 B1 | 9/2001 | Chen et al. | |
| 6,309,580 B1 | 10/2001 | Chou | |
| 6,365,059 B1 | 4/2002 | Pechenik | |
| 6,407,443 B2 | 6/2002 | Chen et al. | |
| 6,520,843 B1 * | 2/2003 | Halley | 451/285 |
| 2003/0219992 A1* | 11/2003 | Schaper | 438/748 |
| 2004/0156108 A1 | 8/2004 | Chou et al. | |

OTHER PUBLICATIONS

"Making Nanowires Lattices in a Snap"—Materialstoday—May 2003—p. 6.
Melosh, Nicholas et al —"Ultrahigh-Density Nanowires Lattices and Circuits" —ScienceExpress—Mar. 13, 2003—pp. 1-12.

* cited by examiner

*Primary Examiner*—Thanhha S. Pham (57) ABSTRACT

An imprinting apparatus and method of fabrication provide a mold having a pattern for imprinting. The apparatus includes a semiconductor substrate polished in a [110] direction. The semiconductor substrate has a (110) horizontal planar surface and vertical sidewalls of a wet chemical etched trench. The sidewalls are aligned with and therefore are (111) vertical lattice planes of the semiconductor substrate. The semiconductor substrate includes a plurality of vertical structures between the sidewalls, wherein the vertical structures may be nano-scale spaced apart. The method includes wet etching a trench with spaced apart (111) vertical sidewalls in an exposed portion of the (110) horizontal surface of the semiconductor substrate along (111) vertical lattice planes. A chemical etching solution is used that etches the (111) vertical lattice planes slower than the (110) horizontal lattice plane. The method further includes forming the imprinting mold.

20 Claims, 9 Drawing Sheets

METHOD FOR FABRICATING A NANO-IMPRINTING MOLD

CROSS REFERENCE TO RELATED APPLICATION

The present application is a divisional of application Ser. No. 10/826,056, filed Apr. 16, 2004, now U.S. Pat. No. 7,141,866.

BACKGROUND

1. Technical Field

The invention relates to the fabrication of nano-scale and micro-scale structures. In particular, the invention relates to molds used in imprinting lithography.

2. Description of Related Art

A consistent trend in semiconductor technology since its inception is toward smaller and smaller device dimensions and higher and higher device densities. As a result, an area of semiconductor technology that recently has seen explosive growth and generated considerable interest is nanotechnology. Nanotechnology is concerned with the fabrication and application of so-called nano-scale structures, structures having dimensions that are often 50 to 100 times smaller than conventional semiconductor structures. Nano-imprinting lithography is a technique used to fabricate nano-scale structures.

Nano-imprinting lithography uses a mold to imprint nano-scale structures on a substrate. A mold typically contains a plurality of protruding and/or recessed regions having nano-scale dimensions. Such a mold is fabricated using electron beam (e-beam) lithography or patterning and dry etching, typically reactive ion etching (RIE) to create a nano-scale pattern in the mold. However, e-beam lithography is slow and therefore of limited use in high throughput or production situations. Moreover, e-beam lithography has limited resolution in the nano-scale range. For example, a mask prepared using micro or nano-patterning techniques (e.g., optical lithography or e-beam writing) has some residual roughness along mask pattern edges. RIE etching through the mask introduces surface roughness in the sidewalls of the patterns of the mold that at least mimic and may further exacerbate the edge roughness of the mask pattern. As such, the mask used in RIE etching defines the sidewall roughness of the nano-patterns of a mold and such roughness remains rough at the micro-scale even with extreme precision writing. Further, the RIE process causes crystal degradation to the mold material.

While holding much promise, the practical use of such fabricated molds has been somewhat limited. In particular, the surface roughness of the mold contributes to undesirable roughness of the imprint patterns of the mold. Further, crystal damage to the mold caused by RIE processing contributes to low mold reliability and limited mold useful life in manufacturing of nano-scale structures. Moreover, the fabrication of the molds is time consuming. As such, the conventional mold can be costly to use.

Accordingly, it would be desirable to fabricate a mold with higher reliability, higher nano-scale resolution, longer useful life and less surface roughness to the mold patterns using potentially low-cost, fabrication techniques at higher throughput. Such a fabricated mold would solve a long-standing need in the area of nanotechnology.

BRIEF SUMMARY

In some embodiments of the present invention, an imprinting apparatus is provided. The imprinting apparatus comprises a semiconductor wafer polished in a [110] direction. As such, the semiconductor wafer has a (110) horizontal planar surface. The semiconductor wafer further has vertical sidewalls of a wet chemical etched trench. The trench vertical sidewalls are aligned with (111) vertical lattice planes of the semiconductor wafer. The semiconductor wafer comprises a plurality of vertical structures between the trench vertical sidewalls. The trench vertical sidewalls and the plurality of vertical structures are spaced apart from each other to form a mold that provides a pattern for imprinting.

In other embodiments of the present invention, a method of fabricating an imprinting apparatus is provided. The method of fabricating comprises wet etching a semiconductor wafer polished in a [110] direction. The semiconductor wafer has a (110) horizontal surface. A portion of the (110) horizontal surface is exposed. The exposed portion is aligned between (111) vertical semiconductor crystal lattice planes of the semiconductor wafer. The semiconductor wafer is wet etched with a chemical etching solution that etches the (111) vertical lattice planes slower than a (110) horizontal semiconductor lattice plane to form a trench having spaced apart (111) vertical sidewalls in the semiconductor wafer. The method of fabricating further comprises forming a mold with a pattern for imprinting. The vertical sidewalls have smooth surfaces relative to vertical sidewalls etched with a dry chemical etching process.

Certain embodiments of the present invention have other features in addition to and in lieu of the features described hereinabove. These and other features of some embodiments of the invention are detailed below with reference to the following drawings.

BRIEF DESCRIPTION OF THE DRAWINGS

The various features of embodiments of the present invention may be more readily understood with reference to the following detailed description taken in conjunction with the accompanying drawings, where like reference numerals designate like structural elements, and in which.

DETAILED DESCRIPTION

Figure 1A:
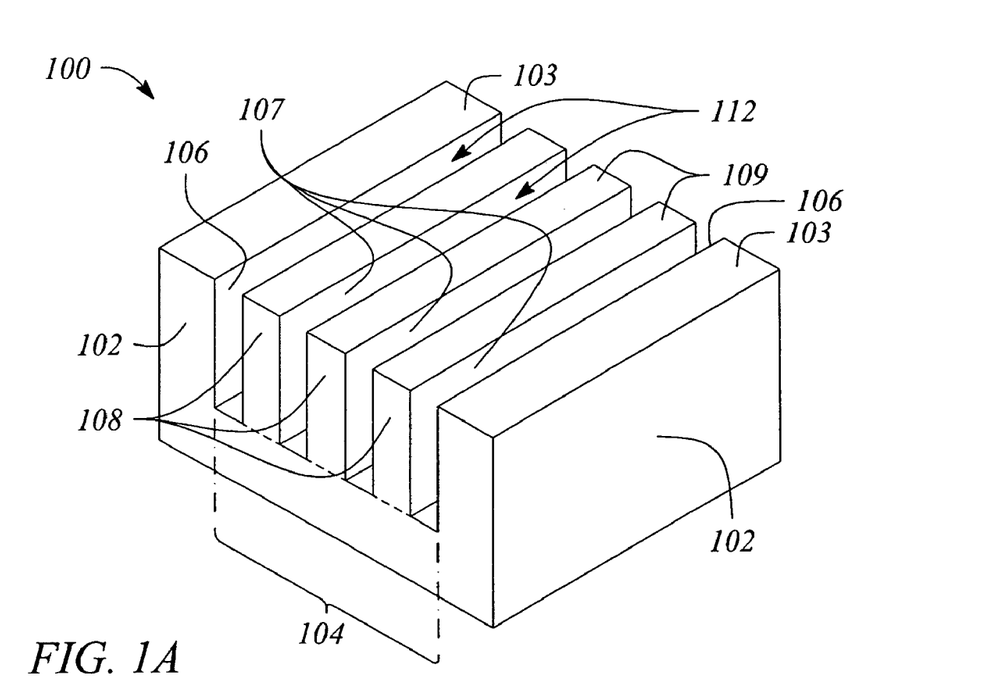
FIG. 1A illustrates a perspective view of an embodiment of an imprinting apparatus according to an embodiment of the present invention.
Figure 1B:
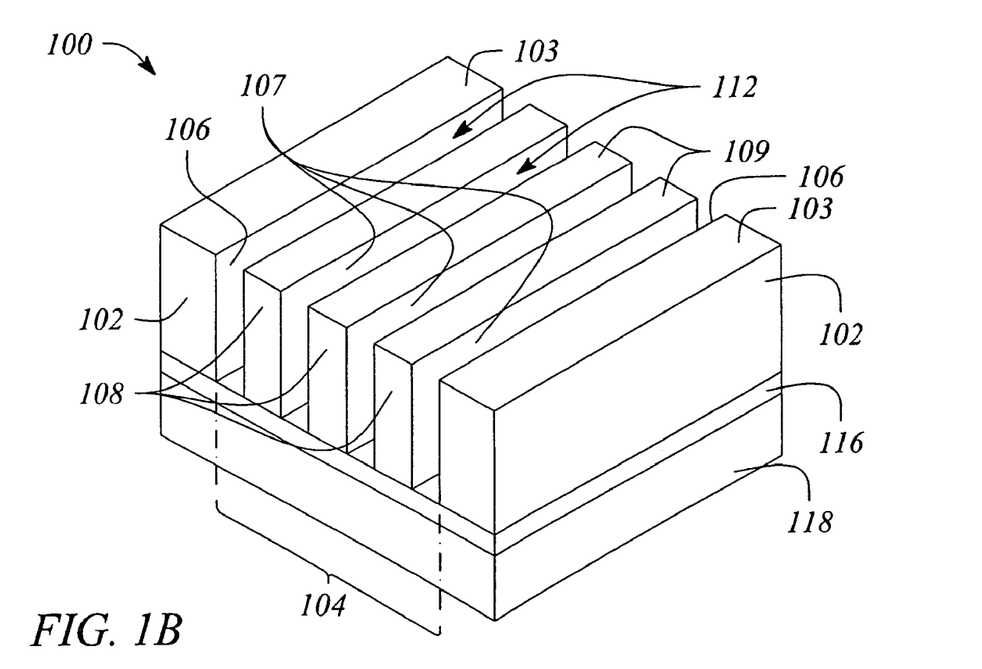
FIG. 1B illustrates a perspective view of another embodiment of an imprinting apparatus according to an embodiment of the present invention.

FIG. 1A illustrates a perspective view of an embodiment of an imprinting apparatus 100 in accordance with an embodiment of the present invention. FIG. 1B illustrates a perspective view of another embodiment of an imprinting apparatus 100 in accordance with an embodiment of the present invention. The apparatus 100 is a nano-imprinting mold 100 having formed therein one or both of a nano-scale mold pattern and a micro-scale mold pattern that, when imprinted on a substrate surface, facilitates forming structures, such as nanowires or other circuit elements, on the substrate surface. The techniques for nano-imprinting with molds are known for example, from U.S. Pat. Nos. 5,772,905; 6,309,580; 6,294,450 and 6,407,443, all of which are incorporated herein by reference in their entirety. Such nano-imprinting techniques are applicable to micro-scale imprinting as well. Therefore while the following description uses the term or prefix 'nano' throughout, in accordance with the various embodiments of the present invention, usage of 'nano' is intended to include within its scope and to apply to 'micro' as well, without limitation, unless otherwise specified. A method of imprinting nano-structures with the apparatus 100 is described below.

Figure 1C:
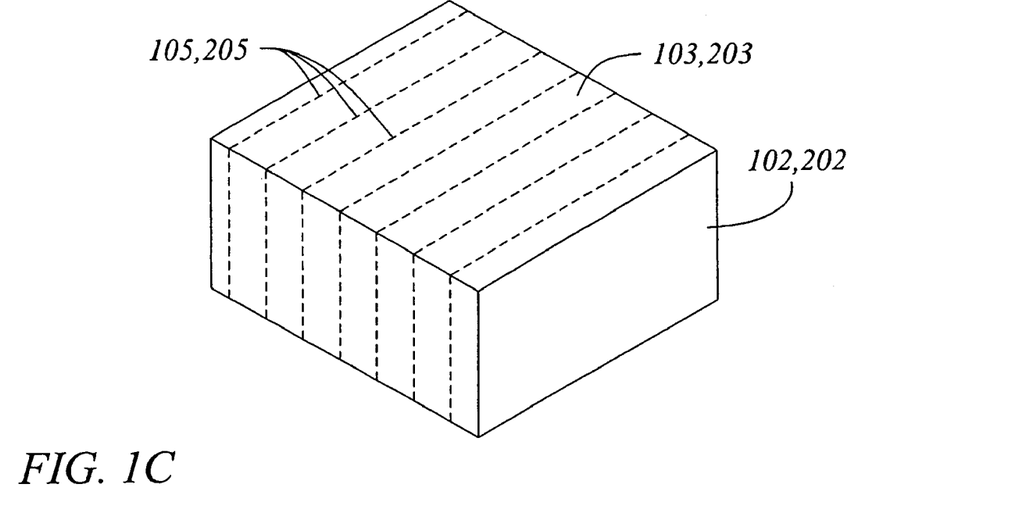
FIG. 1C illustrates a perspective view of a semiconductor wafer or a semiconductor layer of semiconductor on insulator wafer polished in the [110] direction that illustrates (111) vertical crystal lattice planes in the semiconductor by dashed lines used for the apparatus and method according to embodiments of the present invention.

Referring to FIG. 1A, the nano-imprinting apparatus 100 comprises a semiconductor wafer 102 that is polished in a [110] direction. In FIG. 1B, the nano-imprinting apparatus 100 comprises a semiconductor layer over an insulator layer both supported by a wafer polished in the [110] direction. In some embodiments, the apparatus 100 may comprise a silicon-on-insulator (SOI) substrate or wafer having a silicon layer 102 polished in the [110] direction, a silicon dioxide layer 116 and an underlying layer or remainder material 118 of the SOI wafer, typically of silicon or sapphire, for example. The silicon dioxide layer 116 is between the silicon layer 102 and the remainder material 118. FIG. 1C illustrates a perspective view of the semiconductor wafer 102 polished in the [110] direction according to an embodiment of the present invention. FIG. 1C further exemplifies the silicon layer 102 of the SOI substrate or wafer polished in the [110] direction according to another embodiment of the present invention. For simplicity purposes only and not by way of limitation, the term 'wafer' will be used interchangeably herein to mean either a wafer 102 or a layer 102 of a semiconductor on insulator wafer including but not limited to, the silicon layer of the SOI wafer, unless otherwise specified.

For the purposes of the various embodiments of the present invention, the semiconductor wafer or layer (i.e., substrate) may be a single crystal semiconductor material having a diamond crystal structure or a compound semiconductor material having a zinc blende crystal structure, each polished in the [110] direction. As such, the term 'semiconductor', as used herein, is defined to mean one or both of a single crystal semiconductor material having a diamond crystal structure and a compound crystal semiconductor material having a zinc blende crystal structure. A single crystal semiconductor material includes, but is not limited to silicon and germanium (both Group IV). A zinc blende compound semiconductor material includes, but is not limited to, Group III-V compound semiconductors (e.g., GaAs and GaP) and Group II-VI compound semiconductors (e.g., CdTe and ZnS). See S. M. Sze, *Physics of Semiconductor Devices*, Second Edition, John Wiley & Sons, 1981, pp. 8-12 and Appendix F, incorporated herein by reference. Therefore while various embodiments of the present invention are described below using 'silicon' for the wafer material, such use of silicon is by way of example and not limitation. One skilled in the art may use any semiconductor material, as defined above, in the embodiments described herein, without undue experimentation, and still be within the scope of the various embodiments of the present invention.

By [110] direction, it is meant that a major horizontal planar surface 103 of the semiconductor wafer 102 is a (110) horizontal semiconductor crystal lattice plane. Moreover, the semiconductor wafer 102 has a plurality of (111) vertical semiconductor lattice planes 105 that intersect with the major horizontal surface 103. For the purposes of discussion herein, and not by way of limitation, the (110) horizontal crystal lattice plane is considered to be horizontally oriented with respect to a Cartesian coordinate system. The (110) horizontal surface 103 is a (110) horizontal plane. The (111) vertical lattice planes 105 are approximately perpendicular to and intersect with the (110) horizontal surface of the wafer. Therefore for the purposes of discussion herein, the (111) vertical planes are considered to be approximately vertically oriented relative to the (110) horizontal surface or plane of the semiconductor wafer. The use of brackets '[ ]' and parenthesis '( )' herein pertains to a direction and a plane of a crystal lattice, respectively, when used herein to enclose such numbers as 110 and 111, and is intended to follow standard crystallographic nomenclature known in the art.

Referring back to FIGS. 1A and 1B, the nano-imprinting apparatus 100 further comprises opposing sidewalls 106 of a major trench 104 etched in the semiconductor wafer 102, hereinafter 'silicon' wafer 102 by way of example. The sidewalls 106 are internal to the trench 104. In particular, the sidewalls 106 are aligned with spaced-apart ones of the (111) vertical lattice planes 105. Therefore, the sidewalls 106 of the trench 104 are (111) vertical sidewalls 106. The sidewalls 106 have characteristically smooth surfaces due to the use of wet chemical etching to form the trench 104 rather than conventional dry etching techniques, such as reactive ion etching (RIE). In some embodiments, the silicon wafer 102 and in particular, the trench 104 has characteristically reduced crystal structure damage relative to when dry etching techniques (e.g., RIE) are used to form the trench 104.

Wet chemical etching solutions that favor anisotropically etching in the vertical direction much more than the horizontal direction are particularly useful in achieving the mold 100 apparatus of the present invention. See for example, *High-Speed Semiconductor Devices*, Edited by S. M. Sze, A Wiley-Interscience Publication, John Wiley & Sons, Inc., 1990, at least Part I, Section 1.4, pp 33-51. Etching the silicon is described in more detail below with respect to a method of fabricating a nano-imprinting mold.

The nano-imprinting apparatus 100 further comprises a plurality of vertical structures 108 disposed in the trench 104 between the opposing sidewalls 106. The vertical structures 108 are spaced from the opposing sidewalls 106 and further are spaced apart from each other in the trench 104. A vertical structure 108 comprises opposing sides 107 and an end 109. A side 107 of the vertical structure 108 faces one or both of a side 107 of an adjacent vertical structure 108 and a sidewall 106 of the trench 104. In some embodiments, the vertical structures 108 are parallel to each other and to the trench sidewalls 106. In some embodiments, the vertical structures 108 are either also perpendicular or alternatively perpendicular to the trench sidewalls 106 (not illustrated). The end 109 of the vertical structure 108 has a horizontal planar surface that is coplanar with the (110) planar surface 103 of the silicon wafer 102.

In some embodiments, a spacing 112 between the plurality of vertical structures 108 may be considered a plurality of minor trenches 112 relative to the main or major trench 104. In these embodiments, a minor trench 112 is no different from the major trench 104 except for relative trench width. For example, the sides 107 of the vertical structures 108 are (111) vertical sidewalls 107 of a minor trench 112 in these embodiments. These sidewalls 107 are (111) vertical lattice planes having essentially the same smoothness characteristic as that of the sidewalls 106. However, in contrast to FIG. 1A, FIG. 1B further illustrates that the major trench 104 or each minor trench 112 of the plurality has a bottom that contacts the silicon dioxide layer 116 of the SOI wafer.

In other embodiments, the vertical structures 108 are formed separately from the major trench 104. Moreover, the vertical structures 108 may be silicon or a different material than that of the silicon wafer 102, such as silicon nitride, silicon dioxide, or germanium, for example.

The major trench 104 and the interspersed vertical structures 108 between the trench sidewalls 106 of the mold 100 have nano-scale spacing for subsequent nano-imprinting. In some embodiments, the spacing and pitch of the trenches 112, 104 or of the vertical structures 108 can range from about 10 nanometers (nm) to about 5 microns (μm) and in some embodiments, from about 5 nm to about 200 μm, as is further described below.

Figure 2A:
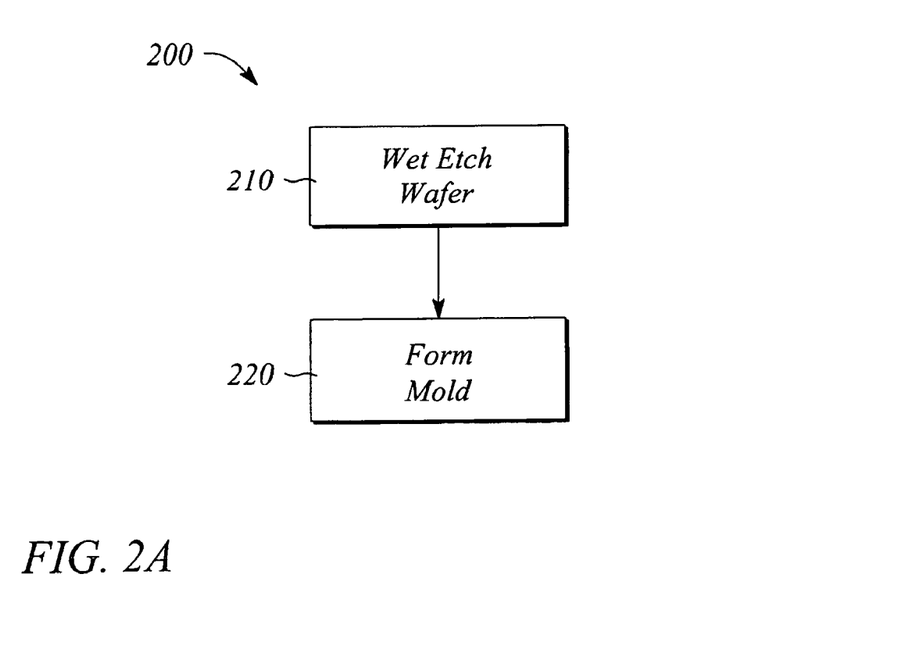
FIG. 2A illustrates a flow chart of an embodiment of a method of fabricating an imprinting mold according to an embodiment of the present invention.

FIG. 2A illustrates a method 200 of fabricating an imprinting mold according to an embodiment of the present invention. FIGS. 2B-2E illustrate perspective views of a semiconductor wafer or layer polished in the [110] direction processed according to the method 200 of FIG. 2A. The method 200 of fabricating comprises wet etching 210 a semiconductor wafer polished in a [110] direction; and forming 220 a mold for nano-imprinting. The polished semiconductor wafer may be a stand-alone silicon wafer or a polished silicon layer of a silicon-on-insulator wafer or substrate, by way of example. Wet etching 210 comprises anisotropically etching along (111) vertical lattice planes with a chemical etching solution that etches much faster in a vertical direction than the solution etches in a horizontal direction. The silicon wafer has etched 210 therein a trench with spaced apart (111) vertical sidewalls of silicon. Typically, the trench is relatively much longer than it is wide and further, is relatively much deeper than it is wide. However, the shape and dimensions of the trench depend on the nano-structure that is to be subsequently imprinted. Such shape and dimensions of the trench are controlled by an etch mask and the parameters of the wet etching process used, for example.

Silicon etching may be accomplished by exposing the silicon substrate to an etching solution, such as a potassium hydroxide (KOH) solution or an ethylene diamine pyrocatechcol (EDP) solution, for example. Exposure to such etching solutions removes silicon material anisotropically to create the trench in the silicon substrate as defined by the etch mask. The target depth is achieved by adjusting the etching time along with solution concentration and temperature.

In an embodiment, the silicon is etched through an etch mask pattern with an etching solution that comprises about 44 weight percent (wt. %) potassium hydroxide with the balance being water (KOH—$H_2O$) at a temperature of about 120 degrees Centigrade (° C.) that produces an etch rate of about 7 μm/min. The etch temperature may range from about room temperature or about 25° C. to about 150° C., depending on the embodiment. Moreover, the concentration of the KOH solution may range from about 5 wt. % to about 70 wt. %, depending on the embodiment.

In another embodiment, the silicon is etched through an etch mask pattern with an etching solution of EDP that comprises about 500 ml $NH_2(CH_2)_2NH_2$: about 88 g $C_2H_4(OH)_2$: about 234 ml $H_2O$ at a temperature of about 110° C. In still another embodiment, the silicon is etched through an etch mask pattern with an etching solution of tetramethylammonium hydroxide (TMAH). TMAH allows for the use of different etch mask materials than those used with the KOH etching solution, as described further below.

For example, etching solutions such as KOH, EDP and TMAH attack or etch (111) planes in the silicon substrate as much as one hundred times more slowly than they etch other planes, e.g., the (110) planes. As such, relatively deep narrow trenches can be produced with depth-to-width aspect ratios of almost 100:1 when etching the (110) polished substrate through an etch mask.

According to the method 200, the vertical sidewalls of the etched 210 trench have smooth surfaces relative to vertical sidewalls etched with the conventional dry chemical etching process. In some embodiments, the etched 210 silicon wafer further has reduced crystal structure damage relative to a silicon wafer etched with the conventional dry chemical etch process. The resultant silicon structure forms 220 a nano-scale mold for subsequent nano-imprinting that is more reliable and that may produce finer (i.e., less rough surfaces) nano-structures than conventional nano-imprinting molds.

The number of trenches that may be etched into a silicon wafer during the method 200 is dependent on the final nano-structure(s) to be subsequently imprinted and not considered a limitation herein. In some embodiments, a trench ultimately represents a nanowire (i.e., the trench is a negative of the nanowire) having a length, a width and a depth. Therefore, a mold may be formed 220 such that the trenches are spaced apart to achieve desired nanowire width, height and pitch in the final nano-structure. The final nano-structure achieved is limited by one or more of the capability of the etching and/or lithographic technologies used and further, the atomic spacing of the (111) vertical lattice planes in the silicon, for example.

In some embodiments of wet etching 210, the silicon wafer or SOI wafer with a silicon layer that is polished in the [110] direction is provided. Referring back to FIG. 1C, an exemplary silicon wafer or layer 202 polished in the [110] direction is illustrated. The term 'silicon wafer 202' is used herein interchangeably with a silicon layer 202 of an SOI wafer that is polished in the [110] direction, unless stated otherwise. The silicon wafer 202 has a planar surface 203 aligned with a (110) horizontal silicon lattice plane. Silicon wafers and silicon-on-insulator (SOI) wafers polished in the [110] direction can be obtained from isonics Corp., located in Golden, Colo. and Columbia, Md., having a website address of http://www.isonics.com. Another source for silicon wafers or silicon-on-insulator (SOI) wafers polished in the [110] direction is SOITEC USA Inc., Peabody, Mass., having a website address of http://www.soitec.com. Other semiconductor wafer materials may be obtained from one or both of these supplier as well.

Figure 2B:
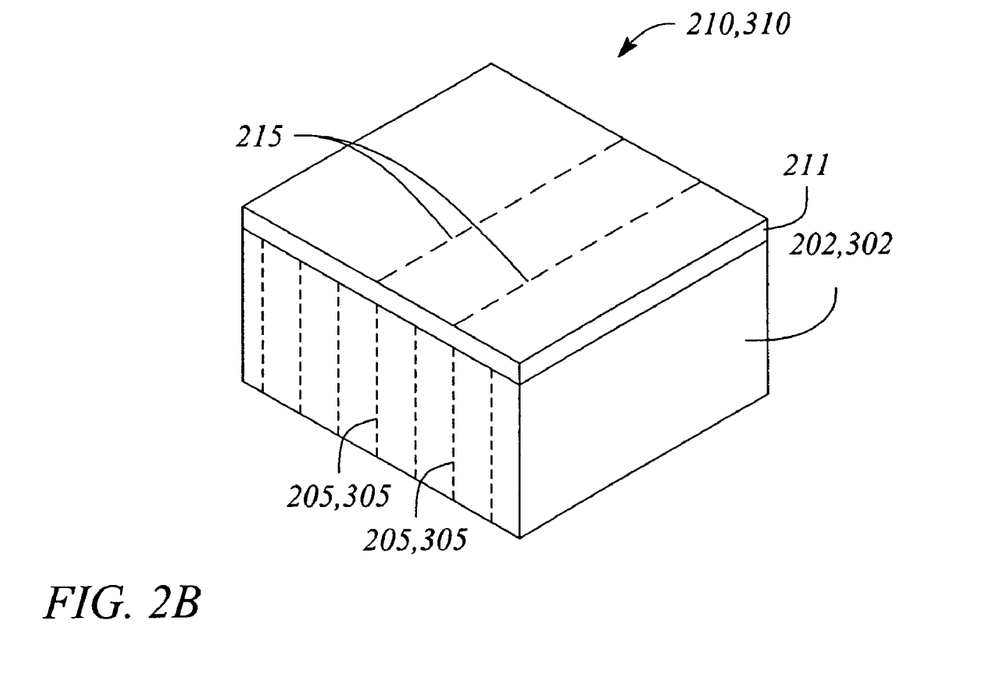
FIG. 2B illustrates a perspective view of the semiconductor wafer or layer of FIG. 1C having a mask layer on the substrate surface according to an embodiment of the present invention.

In these embodiments, wet etching 210 further comprises masking the (110) horizontal surface 203 with an etch mask. A mask material is deposited and/or grown on the (110) horizontal surface of the silicon wafer 202. FIG. 2B illustrates a perspective view of the semiconductor wafer 202 of FIG. 1C having a layer 211 of masking material covering the (110) horizontal surface 203. Further illustrated in FIG. 2B are dashed lines 215 representing hypothetical alignment marks that align with underlying (111) vertical lattice planes 205 in the semiconductor wafer 202. In some embodiments, a thermal oxide layer 211 of silicon dioxide may be grown on the (110) horizontal surface 203 of the exemplary silicon wafer or layer 202. A thermal oxide layer can be grown on the silicon surface according to known techniques using heat and, in some embodiments, the introduction of oxygen in a controlled atmosphere for the purposes of the method 200. Alternatively or additionally, an oxide layer can be deposited on the silicon using plasma enhanced chemical vapor deposition (PECVD) at about 400° C., for example. A thermal oxide layer is more resistant to the KOH wet etching solution than the PECVD oxide layer, for example.

In other embodiments, the masking layer 211 is selected from an oxide material, a polymer material and a composite material that resists attack by the etchant solution used for anisotropically etching the semiconductor wafer 202. For example, the oxide, polymer or composite masking layer 211 will resist one or more of KOH, EDP and TMAH attack during etching of the silicon wafer 202. The oxide, polymer or composite masking layers 211 may be deposited or applied by spin coating onto the surface 203, for example, using known techniques.

Once grown and/or deposited, the masking layer 211 is patterned to serve as the etch mask 211 for subsequent etching. As used herein, 'patterning' or 'patterned' refers to defining and producing a final pattern, or a final pattern defined and produced, in the masking layer, for example. As such, 'patterning' or 'patterned' is not limited to any process used to so define and produce such a final pattern. In particular, in some embodiments patterning the masking layer may comprises any technique including, but not limited to, conventional photolithography, imprint lithography and electron-beam lithography, along with an applied resist or similar masking material or masking process, or ion milling. With such patterning, a portion of the masking layer 211 is removed by one or both of reactive ion etching (RIE) and wet chemical etching, for example.

As used herein, 'etching' generally refers to any process by which material is removed either selectively or nonselectively. Thus, 'oxide etching' refers to any process that removes oxide of the oxide masking layer 211. In some embodiments, dry chemical processing such as, but not limited to, using plasmas or ion beams, may be employed to etch the masking layer 211. Moreover, patterning described hereinabove determines the locations of the mask etching.

For example, RIE may be employed to selectively etch the masking layer 211. RIE is a specialized plasma dry chemical processing that is known to achieve anisotropic material removal. In another example, various plasmas can be used with an unbiased substrate to produce generally isotropic etching of the masking layer 211. In yet another example, ion milling may be used to etch the masking layer 211. Ion milling is a form of ion beam dry chemical processing that is inherently anisotropic. See for example, *High-Speed Semiconductor Devices*, cited supra, at pg. 49. In some embodiments, a photoresist mask is patterned on the oxide layer using conventional photolithography techniques that are known in the art. Then trifluoromethane (CHF$_3$) and Argon (Ar) gases are used in RIE to pattern the oxide layer through the photoresist mask, for example. Once the oxide layer is patterned with RIE, the photoresist mask is removed using known techniques.

Selective removal of portions of the masking layer 211 exposes selected portions of the underlying (110) horizontal surface 203 of the silicon substrate 202 while leaving other portions unexposed. The selected exposed and unexposed portions are defined by the aligned patterned edges of the etched mask layer 211. The patterned mask layer 211 essentially forms an etch mask 211 for later processing of the silicon substrate 202.

Figure 2C:
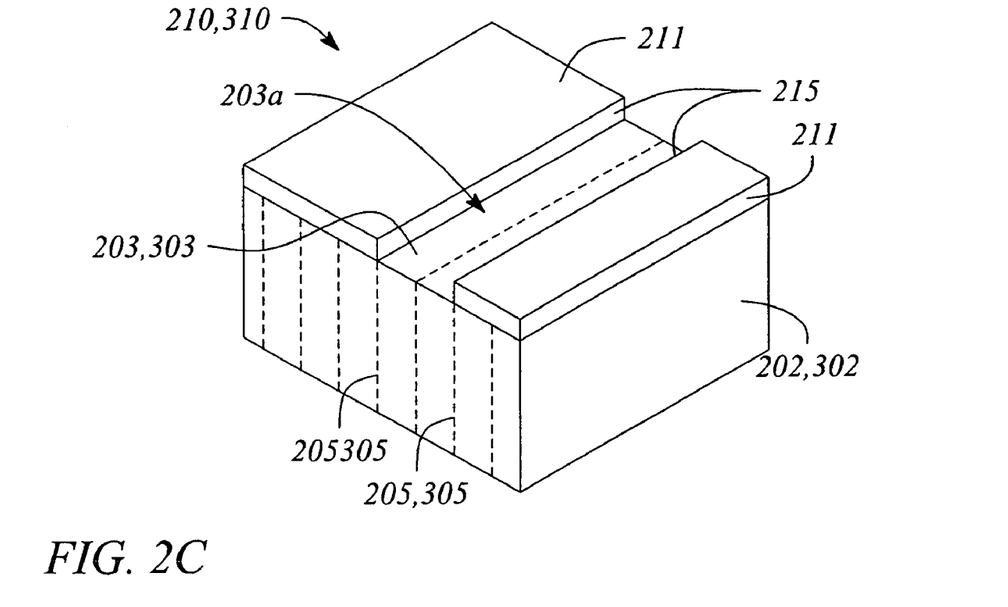
FIG. 2C illustrates a perspective view of the semiconductor wafer or layer of FIG. 2B in which the mask layer is patterned to expose a portion of the underlying (110) horizontal surface of the semiconductor wafer according to an embodiment of the present invention.

Mask edges 215 defined by patterning the masking layer establish locations on the (110) horizontal surface where the trench vertical sidewalls will be etched 210 in the silicon wafer. In particular, the edges of the etch mask 211 lie along, or are aligned with, the intersection of one or more (111) vertical lattice planes with the (110) horizontal surface of the silicon wafer. FIG. 2C illustrates a perspective view of the semiconductor wafer or layer 202 of FIG. 2B with a portion of the (110) horizontal surface 203 exposed after patterning the mask layer 211 to form the etch mask 211.

In FIG. 2C, a portion 203a of the (110) horizontal surface 203 is exposed. Edges 215 of the etch mask 211 are aligned with edges of the exposed (110) surface portion 203a and coincide with intersecting (111) vertical lattice planes 205 of the silicon wafer 202. The silicon wafer 202 is subsequently etched 210 between the edges 215 of the etch mask 211 from the exposed (110) surface portion 203a, as described further below.

Figure 2D:
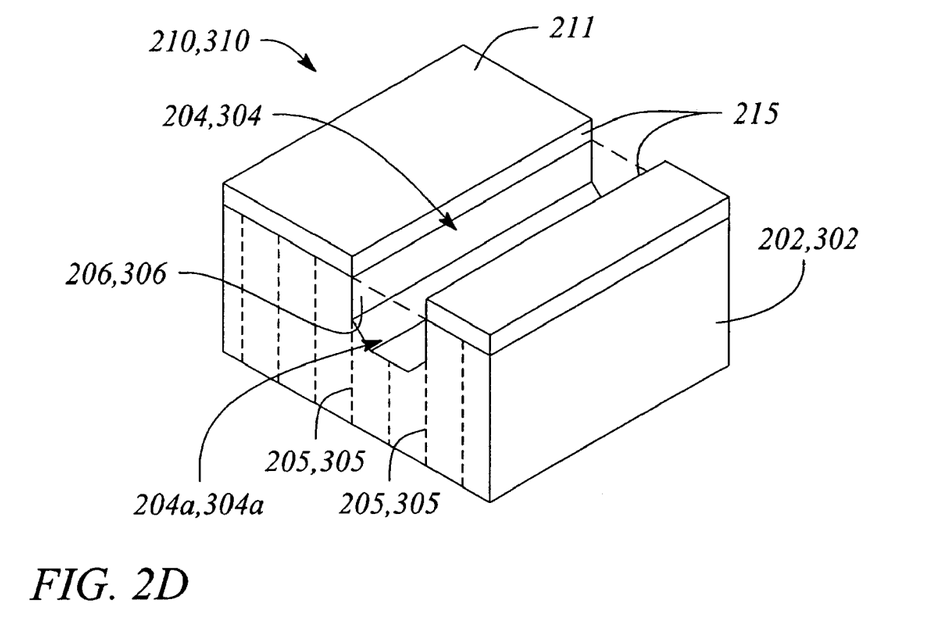
FIG. 2D illustrates a perspective view of the semiconductor wafer or layer of FIG. 2C during wet chemical etching according to an embodiment of the present invention.
Figure 2E:
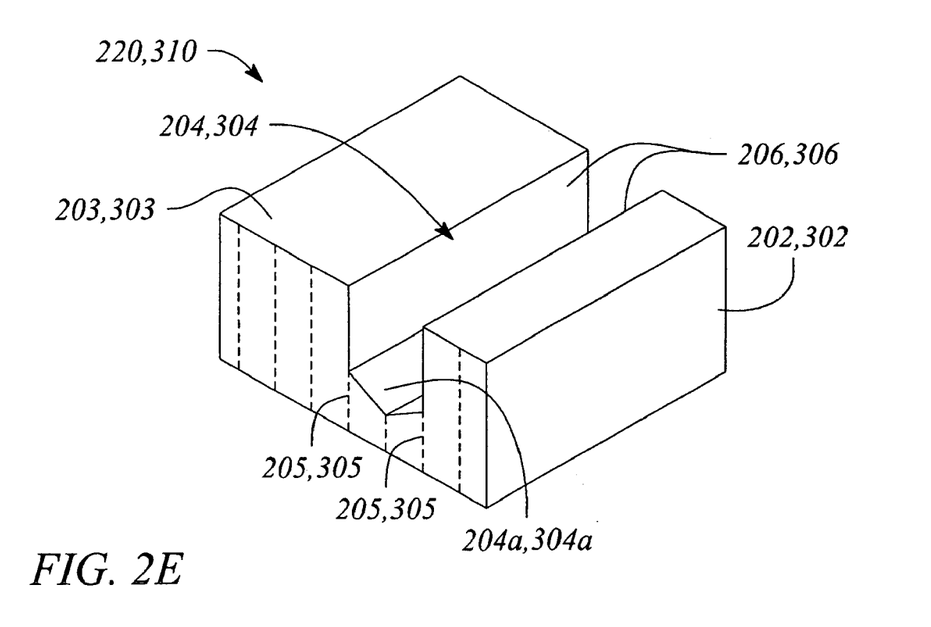
FIG. 2E illustrates a perspective view of the semiconductor wafer or layer of FIG. 2D at completion of wet chemical etching according to an embodiment of the present invention.

FIG. 2D illustrates a perspective view of the semiconductor wafer or layer of FIG. 2C during wet chemical etching according to an embodiment of the present invention. As illustrated in FIG. 2D, the exemplary silicon wafer 202 is being wet etched 210 anisotropically to form a trench 204 having parallel vertical sidewalls 206 along (111) vertical lattice planes 205. Wet etching 210 is described in more detail above. FIG. 2E illustrates a perspective view of the semiconductor wafer or layer 202 of FIG. 2D at completion of wet chemical etching 210 according to an embodiment of the present invention.

The etch mask 211 is also removed from the (110) horizontal surface 203 of the silicon wafer 202 in FIG. 2E.

The etch mask 211 is removed at the completion of wet etching 210, such as using hydrofluoric acid (HF) for a thermal oxide etch mask, for example, according to known techniques of oxide removal.

The etched trench 204 has a bottom 204a that is approximately horizontal or laterally extending relative to the trench vertical sidewalls 206. The shape of the trench bottom 204a is illustrated generally as an approximate V-shape, but may be approximately U-shaped, some combination of the V and U shapes, or simply planar, without limitation herein. For example, in some embodiments that use an SOI wafer, the silicon layer is etched 210 according to the method 200, until the etchant reaches the silicon dioxide layer. As such, the trench bottom is approximately planar or flat. As illustrated in FIG. 1B for example, the silicon dioxide layer 116 is between the silicon layer 102 and the remainder material layer 118 of the SOI wafer. The silicon dioxide layer 116 effectively provides the planar bottom of the etched trench.

FIG. 2E essentially illustrates an imprinting mold formed 220 by the method 200 of fabricating of the present invention. Only one trench 204 in the silicon wafer 202 of the mold is illustrated in FIG. 2E for simplicity, and not by way of limitation. The formed 220 mold may have a plurality of trenches similarly etched therein, as illustrated in FIGS. 1A and 1B, for example. In some embodiments, a mold with a plurality of trenches is formed 220 using the method 200 as described above, by patterning the masking layer 211 with a corresponding plurality of etch mask edge pairs 215 that is aligned with a plurality of spaced apart pairs of (111) vertical lattice planes 205. A width of an etched trench 204 and the spacing between the etched trenches 204 essentially dictate a width and pitch of structures, respectively, subsequent formed by imprinting with the formed 220 mold. In some embodiments of the method 200, the width of an etched trench 204 (or equivalently a space between adjacent (111) vertical sidewalls 206) ranges from about 5 nm to about 100 µm. Moreover, in some embodiments of the method 200, spacing of adjacent trenches 204 (i.e., pitch) may range from about 10 nm to about 200 µm. As mentioned above, the term or prefix 'nano' used herein is intended to include within its scope dimensions in one or both of a nanometer range and a micrometer range, without limitation.

Figure 3A:
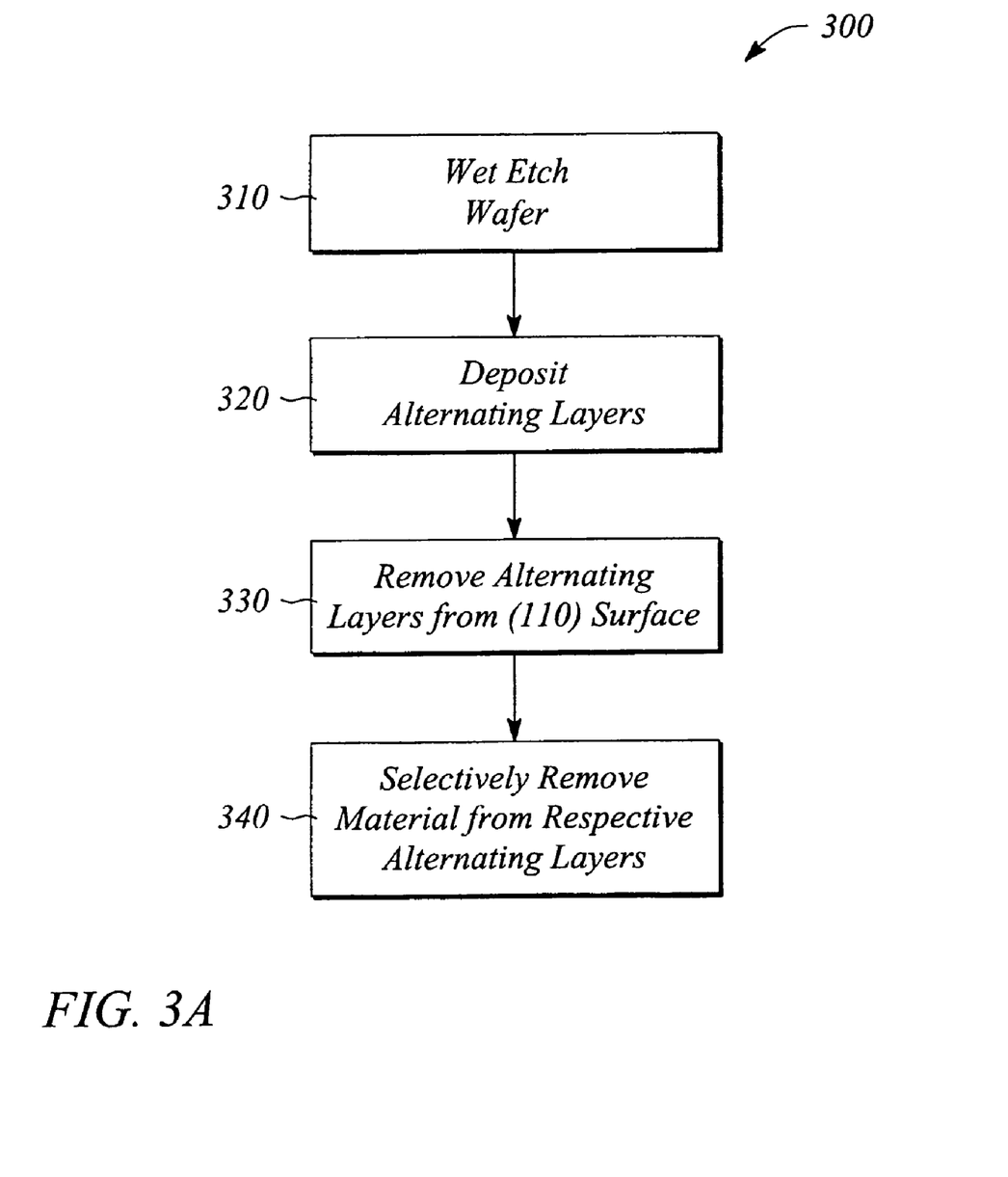
FIG. 3A illustrates a flow chart of another embodiment of a method of fabricating an imprinting mold according to an embodiment of the present invention.
Figure 3B:
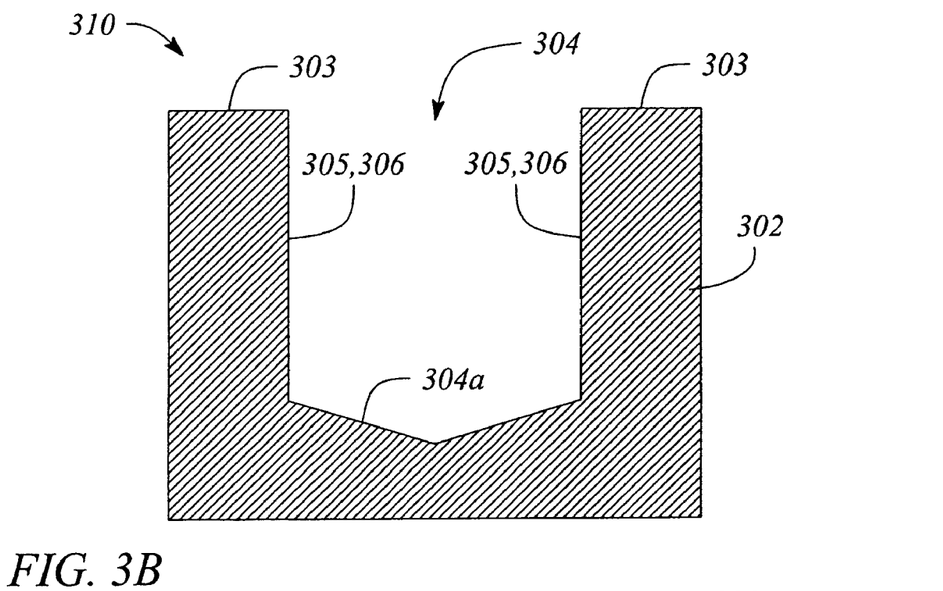
FIG. 3B illustrates a side view of a semiconductor substrate polished in the [110] direction having an etched trench therein according to an embodiment of the present invention.

In other embodiments, a mold with a plurality of trenches is formed by a method of fabricating an imprinting mold having a plurality of vertical structures. FIG. 3A illustrates a flow chart of an embodiment of a method 300 of fabricating an imprinting mold according to another embodiment of the present invention. FIGS. 3B-3E illustrate side views of a semiconductor substrate during fabrication according to the method of FIG. 3A. The semiconductor substrate may be a semiconductor wafer or a semiconductor layer of a semiconductor on insulator wafer, although the insulator layer is not illustrated in FIGS. 3B-3E. The method 300 of fabricating comprises wet etching 310 a semiconductor wafer polished in the [110] direction and is applicable to an exemplary silicon wafer or a silicon layer polished in the [110] direction of an SOI wafer, as essentially described above for wet etching 210 of the method 200 and includes FIGS. 2B-2E. FIG. 3B illustrates a side view of a semiconductor substrate 302 polished in the [110] direction having an etched trench 304 therein according to an embodiment of the present invention. While the bottom of the etched trench 304 of the semiconductor substrate illustrated in FIGS. 3B-3E has an approximate V-shape, in embodiments using the SOI wafer, the etched trench bottom in the polished silicon layer is relatively planar (not illustrated in FIGS. 3B-3E, see instead FIG. 1B). Moreover, the relatively planar trench bottom exposes the insulator layer, such as the silicon dioxide layer that is between the silicon layer and the remainder material of the SOI wafer (not illustrated in FIGS. 3B-3E). The trench 304 comprises opposing vertical sidewalls 306 that are (111) vertical lattice planes 305 of the semiconductor substrate 302, and a trench bottom 304a. The opposing (111) vertical sidewalls 306 are smooth relative to trench sidewalls formed by a dry etching process. In some embodiments, the method 300 is essentially the method 200 that further comprises additional steps of forming 220 a mold.

Figure 3C:
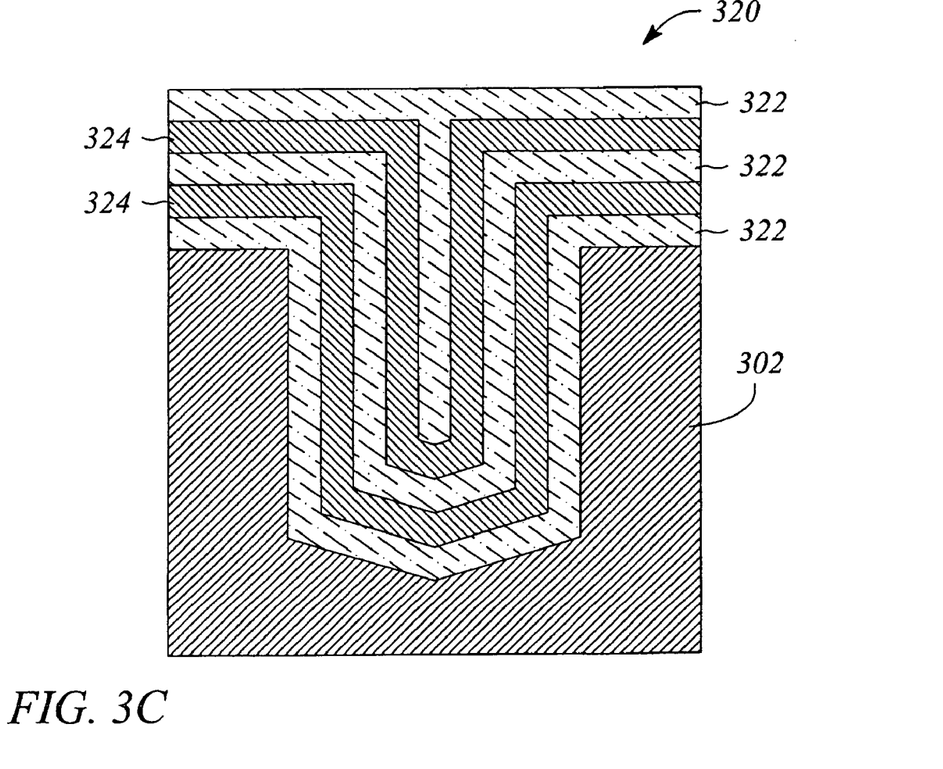
FIG. 3C illustrates a side view of the semiconductor substrate of FIG. 3B with alternating layers of different materials deposited in the trench of the semiconductor substrate according to an embodiment of the present invention.

As illustrated in FIG. 3A, the method 300 of fabricating further comprises depositing 320 alternating layers of a first material 322 and a second material 324 sequentially between the spaced apart (111) vertical sidewalls 306 of the trench 304. The first material 322 is different from the semiconductor substrate and the second material. FIG. 3C illustrates a side view of the semiconductor substrate 302 of FIG. 3B with alternating layers 322, 324 of different materials deposited in the trench 304 thereof. The alternating layers 322, 324 are deposited to cover the sidewalls 306 and the relatively horizontally extending bottom 304a of the trench 304. The alternating layers 322, 324 essentially fill the trench 304.

In some embodiments, the first material 322 is selected from silicon, silicon dioxide, silicon nitride, germanium (Ge), for example, and the second material 324 is independently selected from silicon, silicon nitride, silicon dioxide, germanium, for example. A first layer of the first material is deposited adjacent to the substrate trench sidewall. The second material is deposited on the first material, followed by the first material on the second material, and so on. Deposition of these materials may use a chemical vapor deposition (CVD) process or another process, such as molecular beam epitaxy (MBE), for example. In some embodiments, a plasma enhanced chemical vapor deposition (PECVD) process is used. CVD, PECVD and MBE, and the corresponding gases for deposition are known in the art.

In some embodiments using the exemplary silicon wafer or layer, the alternating layers comprise silicon dioxide as the first material 322 and silicon nitride as the second material 324. The silicon dioxide layer 322 and the silicon nitride layer 324 are deposited using CVD or PECVD. The materials are deposited using known techniques, such as using high temperature conditions (e.g., about 400° C.) with either an oxygen-containing gas or a nitrogen-containing gas, depending on the material being deposited. For embodiments using germanium as either the first material or the second material, a germane gas is used.

In some of these embodiments, the alternating layers 322, 324 further cover the (110) horizontal surface 303 of the silicon wafer 302 at least adjacent to the trench 304, as illustrated in FIG. 3C. Referring back to FIG. 3A, the method 300 of fabricating further comprises removing 330 the alternating layers 322, 324 from a plane corresponding to the (110) horizontal surface 303 that extends cross the trench 304 in these embodiments. The alternating layers 322, 324 are removed from the (110) horizontal surface 303 using one or both of chemical polishing and mechanical polishing. In some embodiments, a polishing slurry that only polishes mechanically is used, such that the materials are removed at approximately the same rate. Polishing slurries are known in the art. In other embodiments, both chemical polishing and mechanical polishing may be used with the caveat that chemical polishing may remove one material faster than the other material.

Figure 3D:
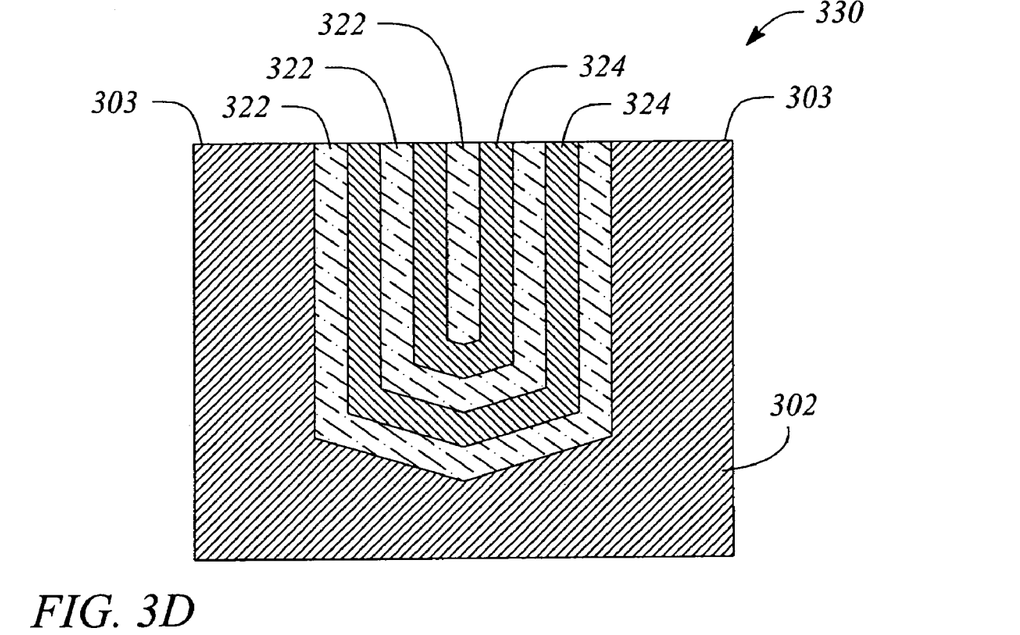
FIG. 3D illustrates a side view of the semiconductor substrate of FIG. 3C with the alternating layers removed from a plane of the (110) horizontal surface according to an embodiment of the present invention.

FIG. 3D illustrates a side view of the semiconductor substrate 302 of FIG. 3C with the alternating layers 322, 324 removed from a plane of the (110) horizontal surface 303. The removal thereof forms an exposed planar surface aligned with the (110) horizontal surface 303 that extends across the trench 304. As illustrated in FIG. 3D, vertically extending portions of each of the alternating layers 322, 324 terminate or end at the exposed planar surface.

Figure 3E:
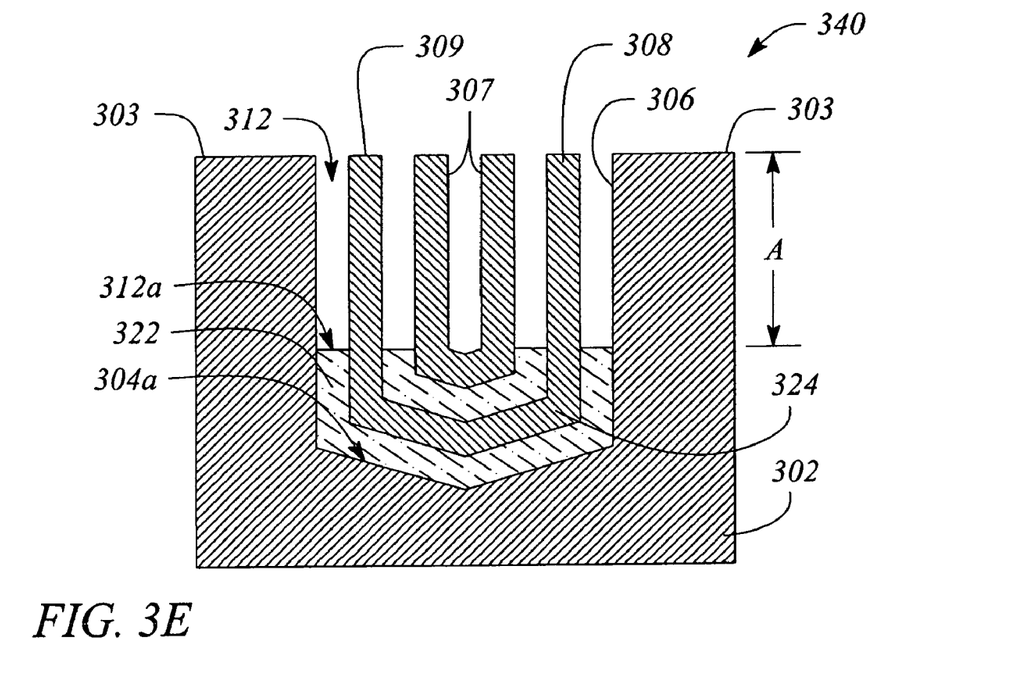
FIG. 3E illustrates a side view of the semiconductor substrate of FIG. 3D after selective removal of one of the materials from vertical portions of respective alternating layers according to an embodiment of the present invention.

Referring back to FIG. 3A, the method 300 of fabricating further comprises selectively removing 340 a material from respective alternating layers. FIG. 3E illustrates a side view of the semiconductor substrate 302 of FIG. 3D after selective removal of one of the materials from vertical portions of respective alternating layers. In the embodiments using a silicon wafer and silicon dioxide as the first material 322 and silicon nitride as the second material 324, the silicon dioxide material 322 is removed from between the silicon nitride layers 324 and from between the trench sidewalls and the silicon nitride layers 324, as illustrated in FIG. 3E. The silicon dioxide 322 is removed 340 from the vertically extending portions thereof to a depth A illustrated in FIG. 3E. The trench 304 still comprises the alternating layers of silicon dioxide 322 and silicon nitride 324 between the trench bottom 304a and the depth A. At the depth A, the trench 304 comprises a relatively flat or planar surface 312a of silicon dioxide 322 between vertical structures or walls 308 of the silicon nitride 324. The silicon dioxide 322 is selectively removed using hydrofluoric acid (HF), for example, or another selective etchant known in the art, that preferentially removes silicon dioxide instead of silicon, germanium and silicon nitride, for example, or removes the silicon dioxide faster than such other materials. In another embodiment where silicon nitride is the first material 322 and either silicon, silicon dioxide or germanium is the second material 324, the silicon nitride may be etched using RIE and tetrafluoromethane gas ($CF_4$) using known techniques. An etch mask that covers the second material 324 but leaves the silicon nitride exposed may be used during etching. Silicon nitride etches faster in $CF_4$ using RIE than does silicon dioxide, silicon and germanium, for example, such that relatively smooth walled trenches of depth A are formed.

A mold results that comprises a plurality of spaced apart vertical structures 308 extending parallel between the (111) vertical sidewalls 306 of the major trench 304. A vertical structure 308 has wall surfaces 307 and an end 309. Further, the removed first material 322 creates spaces 312 (or minor trenches 312 with relatively planar bottoms 312a) between the vertical structures 308. The space 312 between two adjacent vertical structures 308 is in the nano-scale range. Furthermore, the space 312 between a vertical structure 308 and an adjacent (111) vertical sidewall 306 is in the nano-scale range. However, the nano-scale spaces 312 achieved according to the method 300 of fabricating are much smaller than those achieved using the wet etching 210 of the method 200 to form 220 a mold with multiple trenches. This is because the alternating layers 322, 324 are deposited at a thickness of as little as about 5 nm. The thickness of the deposited layers essentially dictates a width of the subsequent space 312 achieved. For some embodiments of the method 300, the space 312 ranges from about 5 nm to about 500 nm.

FIGS. 1A and 1B illustrate a mold fabricated by either the method 200 or the method 300 of fabricating an imprinting mold, depending on the embodiment. As such, the mold ultimately produces nano-scale structures, such as nanowires, or other structural elements, having relatively smooth surfaces in one or both a nano-scale and a micro-scale range of dimensions, as described above, during subsequent imprinting, depending on the embodiment of the present invention.

An example of nano-structure fabrication using the mold apparatus 100 of the present invention is described with reference to FIGS. 4A-4E. Nano-imprinting, as used herein, involves imprinting a negative image of a pattern of the mold 100 into a material relatively softer than the mold 100. The softer material retains the imprinted pattern after the mold 100 is removed during further processing (see FIG. 4A-4B). Typically, a layer of a thermoplastic polymer or UV-curable monomer or other suitable material is applied over a substrate comprising one or both of a semiconductor material and metal material. Thermoplastic polymers, such as polymethylmethacrylate (PMMA) and methylmethacrylate (MMA), or other suitable materials are described in U.S. Pat. No. 6,294,450 to Chen et al., which has been incorporated herein by reference. The imprinted pattern in the soft material layer is then transferred into the substrate as a positive image of the mold through lithography and etching, for example. The transferred pattern can be used for further processing in the formation of nano-scale structures, such as nanowires. There are many ways of transferring the pattern into the substrate. The method described herein is exemplary and provided with the understanding that the embodiments of the present invention are not so limited to the described method.

Figure 4A:
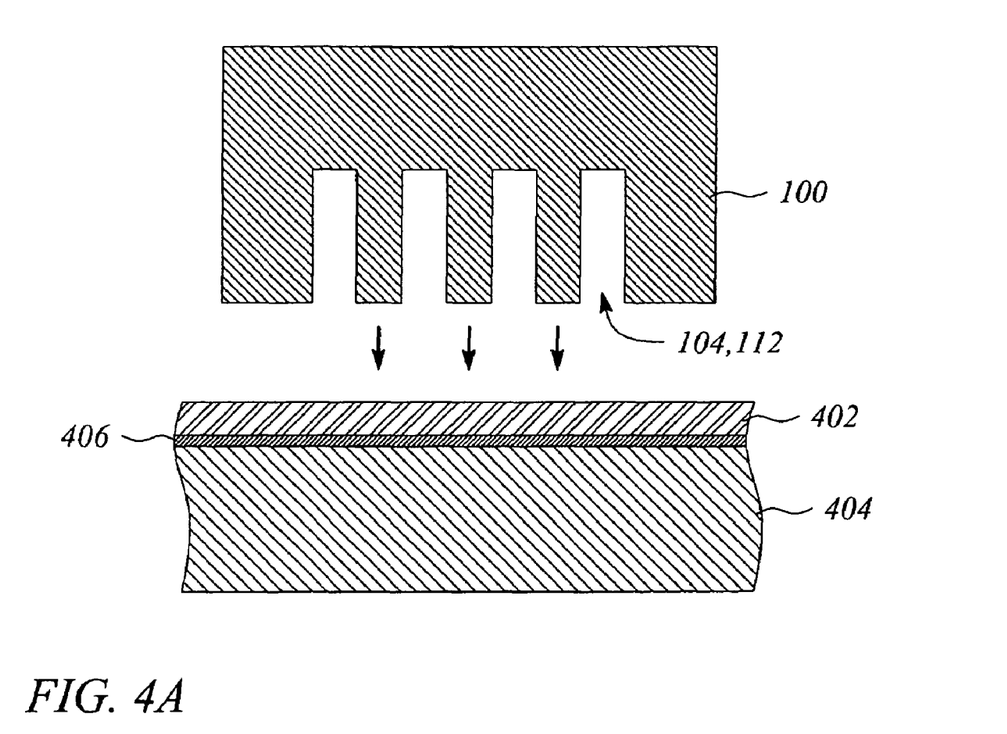
FIGS. 4A-4E illustrate side views of exemplary nano-structures being fabricated on a substrate using the apparatus of FIG. 1A or 1B according to an embodiment of the present invention.
Figure 4B:
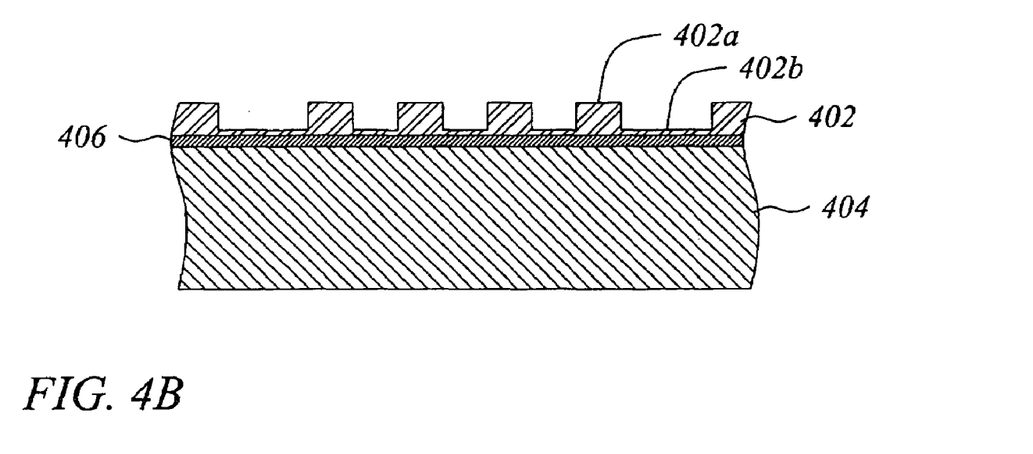
Figure 4C:
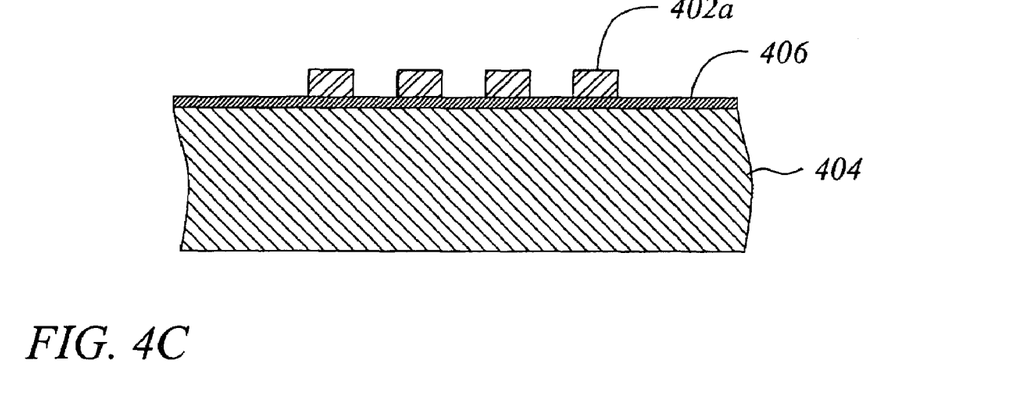
Figure 4D:
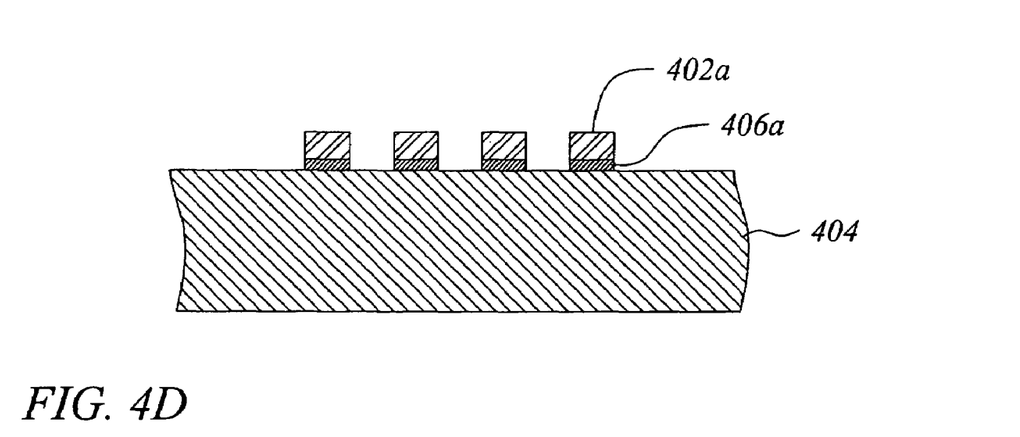
Figure 4E:
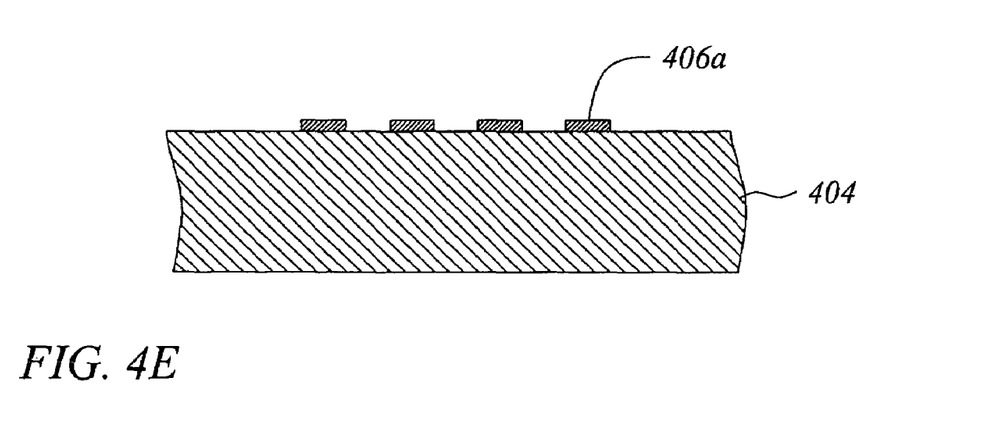

As illustrated in FIG. 4A, the substrate comprises a metal layer 406 deposited in a nano-scale thickness on a surface of a substrate 404. The suitable soft material 402 is applied over the deposited metal 406. The mold apparatus 100 is pressed into the softer material 402 and removed, leaving the mold pattern in the soft material, as illustrated in FIG. 4B. The mold pattern has thick portions 402a and relatively thinner portions 402b. The thinner portions 402b of the soft material 402 are removed, such as by etching with an etchant that removes the soft material 402 in the thin portions 402b but that does not etch the metal layer 406. As illustrated in FIG. 4C, portions of the metal layer are exposed after the removal of the thinner portions 402b of the soft material 402. The exposed portions of the metal layer 406 are then removed using known techniques, leaving only those portions 406a of the metal layer 406 covered by the thicker portions 402a of the soft material 402, as illustrated in FIG. 4D. These portions directly correspond to the trenches 104, 112 in the mold 100. FIG. 4E illustrates the substrate 404 with the remaining soft material 402a removed from the remaining metal portions 406a. The remaining metal portions 406a in FIG. 4E represent nano-structures 406a. Depending on the mold pattern and the embodiment, the nano-structures may be nanowires that run parallel to each other, for example, on the surface of the substrate, or that form a circuit pattern. Further nano-scale devices may be fabricated using these nanowires and the imprinting mold 100. Likewise, micro-scale circuit elements may be imprinted on a substrate using the imprinting mold 100 described herein. For example, the imprinting mold 100 may be used to fabricate micro-scale memory circuit elements on a substrate.

In some embodiments, the subsequent nano-structures have much smoother sidewall surfaces than when e-beam patterning and RIE is used to make the corresponding nano-imprinting mold. The mold's trench sidewalls are atomic flat (i.e., relatively smooth even when measured at the atomic level) when etched along the (111) vertical planes with the wet chemical etchant, according to embodiments of the present invention. Therefore, the corresponding nano-structure sidewalls are atomic flat.

Moreover, in embodiments of the mold made according to the method 300, the first and second materials grown on the wet etched (111) vertical sidewalls of the major trench will be only slightly rougher than the atomic flat (111) vertical sidewall surface. For example, the root-mean-square (RMS) roughness of the (111) vertical sidewall may be about 0.1 nm to about 0.5 nm and an oxide or nitride layer grown on the (111) sidewall has a roughness of about 0.1 nm to about 3 nm. As such, in some embodiments, the nano-structures formed using a mold fabricated according to the method 300 have much smoother sidewall surfaces than if those nano-structures were formed using a mold fabricated conventionally with e-beam lithography and RIE.

The apparatus 100 and method 200, 300 of fabricating according to embodiments of the present invention further provide a relatively easy mold release characteristic because the (111) vertical sidewalls of the mold are smooth when compared to a mold created using conventional e-beam lithography and RIE processes. Moreover, the apparatus 100 and method 200, 300 of fabricating provide a more durable mold than that produced using the conventional RIE processes. The mold is more durable because crystal damage to the silicon caused by RIE is essentially eliminated during the fabrication process according to embodiments of the present invention. Furthermore, the method 200, 300 of fabricating is more amenable to industrial production of molds, due to a higher volume throughput capability, since the method 200, 300 essentially eliminates using e-beam lithography.

Thus, there have been described embodiments of an imprinting apparatus and embodiments of a method of fabricating an imprinting mold. It should be understood that the above-described embodiments are merely illustrative of some of the many specific embodiments that represent the principles of the present invention. Clearly, those skilled in the art can readily devise numerous other arrangements without departing from the scope of the present invention as defined by the following claims.

For example, it should be clear to one skilled in this art that the application of the teachings hereinabove to silicon, which has a diamond crystal structure, may be extended to other materials having a zinc blende crystal structure, as mentioned above. Non-limitive examples include germanium and tin (Group IV elements), Group III-V compound semiconductors, such as arsenides (As), phosphides (P) and antimonides (Sb) of any of aluminum (Al), gallium (Ga), and indium (In) (e.g., GaAs, AlP, InSb), and Group II-VI compound semiconductors, such as CdS, CdSe, CdTe and ZnS). Those skilled in the art would readily know which reagents may be used to perform the preferential etching of these materials, as described above for silicon, without undue experimentation.

By way of example, GaAs (a Group III-V zinc blende compound semiconductor) may be etched along (111) planes using use a solution of $H_2SO_4:H_2O_2:H_2O$ in a ratio of about 1:1:100 (see for example, S. Hirose et al, *Appl. Phys. Letts.* 74 (1999) 964-966, incorporated herein by reference). Moreover, it is within the scope of the various embodiments described herein to use a combination of dry and wet etching processes for some semiconductors wafers, such as for a Group III-V compound semiconductor. For example, using vertical dry etching (e.g., RIE) followed by wet etching to smooth the dry-etched surface may be used for generating vertical (111) planes.

Moreover, references that provide materials and processes useful for processing other semiconductor materials in more detail include, but are not limited to, *Modern GaAs Processing Methods* by Ralph E. Williams, Artech House, (July 1990); *InP-Based Materials and Devices: Physics and Technology* by Osamu Wada (Editor), Hideki Hasegawa (Editor), Wiley-Interscience, (April 1999), pp. 295-309; *InP and Related Compounds: Materials, Applications and Devices* (Optoelectronic Properties of Semiconductors and Superlattices), M. O. Manasreh (Editor), Taylor & Francis, (Aug. 1, 2000); and *Physical Properties of III-V Semiconductor Compounds: InP, InAs, GaAs, GaP, InGaAs, and InGaAsP* by Sadao Adachi, Wiley-Interscience, (Sep. 1, 1992), each incorporated by reference herein. These and other references, such as *High-Speed Semiconductor Devices*, Edited by S. M. Sze, A Wiley-Interscience Publication, John Wiley & Sons, Inc., 1990, and S. M. Sze, *Physics of Semiconductor Devices*, Second Edition, John Wiley & Sons, 1981, also incorporated by reference herein, are readily available to those skilled in the art, such that other semiconductor materials, as defined above, may be used in the embodiments herein without undue experimentation.

What is claimed is:

1. A method of fabricating an imprinting apparatus comprising:

wet etching a semiconductor wafer polished in a [110] direction, the semiconductor wafer having a (110) horizontal surface, a portion of the (110) horizontal surface being exposed, the exposed portion being aligned between (111) vertical lattice planes of the semiconductor wafer, the semiconductor wafer being wet etched with a chemical etching solution that etches the (111) vertical lattice planes slower than a (110) horizontal lattice plane to form a trench having spaced apart (111) vertical sidewalls in the semiconductor wafer, wherein the vertical sidewalls have smooth surfaces relative to vertical sidewalls etched with a dry chemical etching process; and forming a mold with a pattern for imprinting, wherein forming a mold comprises:

depositing alternating layers of a first material and a second material in the trench between the spaced apart (111) vertical sidewalls, the first material being deposited adjacent to the trench sidewalls in a first layer and deposited adjacent to the second material in subsequent layers; and selectively removing the first material from between the trench sidewalls and vertically extending portions of the second material layers, such that spaced apart vertical walls of the second material extend parallel between the (111) vertical sidewalls, the vertical walls having ends coplanar with the (110) horizontal surface of the semiconductor wafer.

2. The method of fabricating of claim 1, wherein the first material is different from the semiconductor substrate and the second material, the first material being selected from silicon dioxide, silicon nitride and germanium, the second material being selected from silicon, silicon dioxide, silicon nitride and germanium, and wherein the first material is selectively removed using an etchant that is more selective for the first material than the trench sidewalls of the substrate and the second material.

3. The method of fabricating of claim 1, further comprising:

removing any of the alternating layers from the (110) horizontal surface before selective removal.

4. The method of fabricating of claim 3, wherein the alternating layers are removed from the (110) horizontal surface using one or both of chemical polishing and mechanical polishing.

5. The method of fabricating of claim 1, wherein the mold pattern has a vertical sidewall spacing in one or both of a nanometer range and a micrometer range.

6. A method of fabricating a nano-imprinting mold comprising:
    masking a (110) horizontal planar surface of a semiconductor wafer polished in the [110] direction with an etch mask aligned with a (111) vertical lattice plane in the semiconductor wafer;
    wet etching the semiconductor wafer along the (111) vertical lattice plane, such that a trench is formed having vertical sidewalls and a relatively horizontal bottom, the vertical sidewalls having the (111) vertical lattice planes of the semiconductor wafer;
    depositing alternating layers of a first material and a second material on the wet-etched semiconductor wafer, such that the alternating layers cover the sidewalls and the bottom of the trench; and
    selectively removing the first material from between the trench sidewalls and vertically extending portions of the second material layers in the trench, such that nano-scale spaced vertical walls of the second material extend parallel between the vertical sidewalls of the trench, the spaced apart walls and the vertical sidewalls forming a nano-scale mold for nano-imprinting.

7. The method of fabricating of claim 6, wherein the alternating layers are further deposited on the (110) horizontal planar surface of the semiconductor wafer, and wherein the method further comprises removing the alternating layers from the (110) horizontal planar surface before selectively removing.

8. The method of fabricating of claim 7, wherein the alternating layers are removed from the (110) horizontal planar surface using mechanical polishing, the mechanical polishing making the ends of the walls coplanar with the exposed (110) horizontal planar surface.

9. The method of fabricating of claim 6, wherein wet etching comprises using an etching solution that etches the (111) vertical lattice planes slower than (110) horizontal lattice planes of the semiconductor wafer.

10. The method of fabricating of claim 6, wherein wet etching provides one or both of smooth sidewall surfaces and reduced crystal damage to the semiconductor wafer relative to a semiconductor wafer etched with a dry chemical etchant.

11. The method of fabricating of claim 6, wherein the semiconductor wafer is a silicon layer of a silicon-on-insulator wafer polished in the [110] direction.

12. The method of fabricating of claim 6, wherein the first material is different from the semiconductor wafer and the second material, the first material and the second material being independently selected from silicon, silicon dioxide, silicon nitride and germanium, the semiconductor wafer being a material selected from one of an element from Group IV, elements from Group III-V, and elements from Group II-VI.

13. The method of fabricating of claim 6, wherein the semiconductor wafer is a material selected from one of a Group IV element, Group III-V elements, and Group II-VI elements.

14. A method of fabricating a nano-imprinting mold comprising:
    depositing alternating layers of a first material and a second material on vertical sidewalls and a bottom of a trench formed in a semiconductor wafer having a [110] direction, the first material being different from the second material and the semiconductor wafer; and
    selectively removing the first material from between the vertical sidewalls and vertically extending portions of the second material layers in the trench, such that nano-scale spaced apart vertical walls of the second material in the trench form a nano-scale mold for nano-imprinting.

15. The method of fabricating of claim 14, wherein the first material is selectively removed using an etchant that is more selective for the first material than the vertical sidewalls of the semiconductor wafer and the second material.

16. The method of fabricating of claim 14, wherein the mold has a vertical wall spacing in one or both of a nanometer range and a micrometer range.

17. The method of fabricating of claim 14, wherein the semiconductor wafer is polished in the [110] direction.

18. The method of fabricating of claim 14, wherein the first material and the second material are independently selected from silicon, silicon dioxide, silicon nitride and germanium, and wherein the semiconductor wafer is a material selected from a Group IV element, a compound semiconductor from Group III-V, and a compound semiconductor from Group II-VI.

19. The method of fabricating of claim 14, further comprising forming the trench in the semiconductor wafer, wherein forming the trench comprises:
    masking a (110) horizontal planar surface of the semiconductor wafer with an etch mask aligned with a (111) vertical lattice plane in the semiconductor wafer; and
    wet etching the semiconductor wafer along the (111) vertical lattice plane, such that the trench is formed having the vertical sidewalls and the bottom, the vertical sidewalls having the (111) vertical lattice planes of the semiconductor wafer.

20. The method of fabricating of claim 19, further comprising:
    removing any of the alternating layers from the (110) horizontal surface before selectively removing the first material, wherein the alternating layers are removed from the (110) horizontal surface using one or both of chemical polishing and mechanical polishing.

* * * * *

UNITED STATES PATENT AND TRADEMARK OFFICE
CERTIFICATE OF CORRECTION

PATENT NO. : 7,368,395 B2 Page 1 of 1
APPLICATION NO. : 11/601084
DATED : May 6, 2008
INVENTOR(S) : M. Saif Islam et al.

It is certified that error appears in the above-identified patent and that said Letters Patent is hereby corrected as shown below:

On the face page, in field (54), "Title", in column 1, lines 1-2, delete "METHOD FOR FABRICATING A NANO-IMPRINTING MOLD" and insert -- APPARATUS FOR IMPRINTING LITHOGRAPHY AND FABRICATION THEREOF --, therefor.

In column 1, lines 1-2, delete "METHOD FOR FABRICATING A NANO-IMPRINTING MOLD" and insert -- APPARATUS FOR IMPRINTING LITHOGRAPHY AND FABRICATION THEREOF --, therefor.

Signed and Sealed this

Fourteenth Day of July, 2009

JOHN DOLL
*Acting Director of the United States Patent and Trademark Office*